United States Patent
Gonzalez et al.

(10) Patent No.: US 6,819,096 B2
(45) Date of Patent: Nov. 16, 2004

(54) POWER MEASUREMENT MECHANISM FOR A TRANSFORMER COUPLED PLASMA SOURCE

(75) Inventors: Juan Jose Gonzalez, Fort Collins, CO (US); Steven J. Geissler, Fort Collins, CO (US); Fernando Gustavo Tomasel, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 10/356,176

(22) Filed: Jan. 31, 2003

(65) Prior Publication Data

US 2004/0150386 A1 Aug. 5, 2004

(51) Int. Cl.$^7$ .............................................. G01R 31/00
(52) U.S. Cl. ................... 324/117 R; 324/126
(58) Field of Search .............................. 324/158.1, 73.1, 324/765, 126, 127; 156/117 R, 345.35; 219/121.43

(56) References Cited

U.S. PATENT DOCUMENTS

| | | | | |
|---|---|---|---|---|
| 4,431,898 A | * | 2/1984 | Reinberg et al. | 219/121.43 |
| 6,432,260 B1 | * | 8/2002 | Mahoney et al. | 156/345.35 |

* cited by examiner

*Primary Examiner*—Vinh P. Nguyen
(74) *Attorney, Agent, or Firm*—Blakely Sokoloff Taylor & Zafman LLP

(57) ABSTRACT

According to one embodiment, an apparatus is described. The apparatus includes a vacuum chamber and an electrical transformer to induce an electromagnetic field within the vacuum chamber. The transformer includes a primary winding, a secondary winding formed by the plasma loop, and a separate secondary winding implemented to measure the voltage along the plasma loop. The apparatus also includes a current transformer to measure the current flow through the plasma loop.

8 Claims, 4 Drawing Sheets

POWER MEASUREMENT MECHANISM FOR A TRANSFORMER COUPLED PLASMA SOURCE

FIELD OF THE INVENTION

The present invention relates to the field of plasma sources; more particularly, the present invention relates to transformer coupled plasma sources.

BACKGROUND

Inductively coupled plasmas (ICP) are routinely used in a number of different applications including materials processing, production of activated gases, pollutant abatement and many others. In such devices, a coil is placed in close proximity to, around or within a vacuum chamber. When the coil is excited with radio frequency (RF), the electromagnetic fields induced around the coil create and sustain a gas plasma discharge within the vacuum apparatus. The plasma is coupled to the coil either through the air or through a magnetic core. In the latter case, the sources are called transformer coupled plasma (TCP) sources. The power supply used to excite the coil is usually composed of a direct current (DC) section followed by an RF section.

Often, it is desirable to know the amount of RF power delivered to the plasma discharge. In order to calculate the amount of power delivered, voltage and current values, as well as the phase angle between the voltage and current, must be measured. Typically, these measurements are effected directly on the plasma load.

Nevertheless, in some TCP applications voltage and current measurements are taken at the output of the DC section of the power supply. Although this methodology makes both the measurement and the calculation easier, the value of the power obtained is not an accurate estimate of the power delivered to the plasma due to losses in the switches of the RF section and other lossy components in the circuit located between the output of the DC section and the plasma load.

Alternatively, some applications implement RF measurements at some point between the output of the power supply and the TCP reactor. Due to the time variation of the signals, these measurements are generally not as precise as the measurements effected at the input of the DC section of the power supply. The advantage of this type of measurement is that they exclude the losses attributed to the components in the RF power generator. However, other losses continue to be present. Thus, accurate values of the power delivered to the plasma are difficult to obtain by measuring current and voltage at the output of the RF power supply.

Therefore, a mechanism to provide a direct estimation of the power delivered to the plasma discharge is desired.

SUMMARY

The invention relates to a method for providing a direct estimation of the power delivered to the plasma in a TCP source. According to one embodiment, an apparatus is described. The apparatus includes a vacuum chamber and an electrical transformer to induce an electromagnetic field within the vacuum chamber. The transformer includes a primary winding, a secondary winding formed by the plasma loop, and a separate secondary winding implemented to measure the voltage along the plasma loop. The apparatus also includes a current transformer to measure the current flow through the plasma loop.

DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding.

DETAILED DESCRIPTION

According to one embodiment, a method for estimating the power delivered to the plasma in a TCP source is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
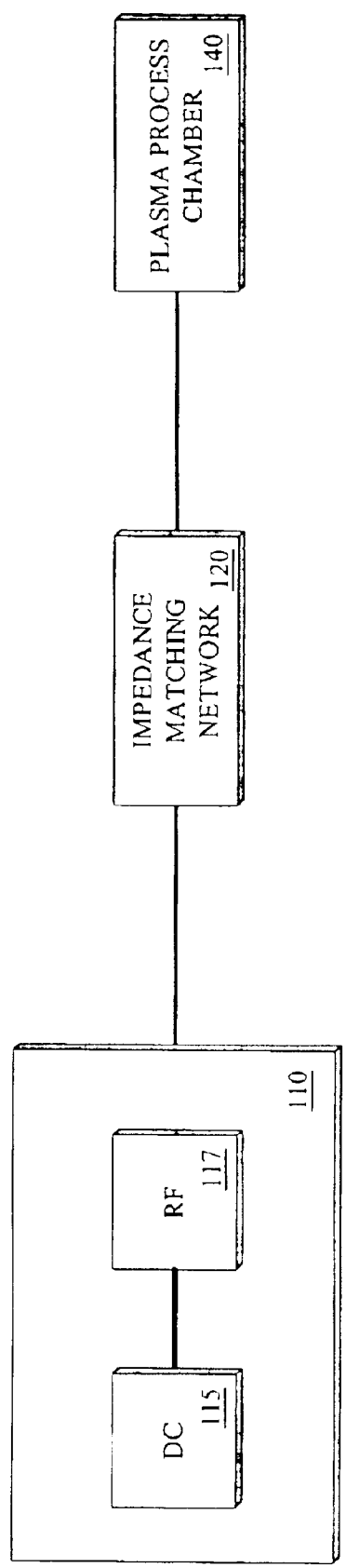
FIG. 1 illustrates one embodiment of a plasma source coupled to a radio frequency (RF) power generator via an impedance matching network.

FIG. 1 illustrates one embodiment of a remote TCP source 140 coupled to a RF power generator 110 via an impedance matching network 120. RF power generator 110 is a power supply that includes a DC section 115 and an RF output section 117.

Impedance matching network 120 is coupled to RF power generator 110. Impedance matching network 120 matches the impedance range of the TCP source 140 to the output impedance of the power generator 110.

Although the present embodiment is illustrated implementing an impedance matching network, one of ordinary skill in the art will appreciate that the impedance matching network may be removed without affecting the scope of the invention.

Plasma source 140 is coupled to impedance matching circuit 120. In one embodiment, plasma source 140 operates via a transformer coupled (TCP) source and utilizes at least one ferrite transformer (not shown) to induce closed path electron drift currents around plasma source 140.

Figure 2:
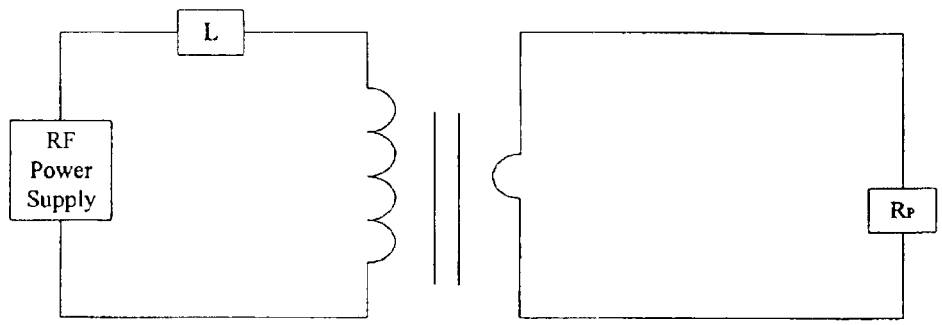
FIG. 2 illustrates an electrical representation of an exemplary plasma source coupled to an RF power generator.

FIG. 2 illustrates an electrical representation of an exemplary TCP apparatus. The apparatus includes an RF power supply, an internal (or external) inductor, a transformer and a resistance connected to the secondary winding of the transformer. The secondary winding of the transformer and the resistance represent the plasma load.

In various applications it may be desirable for the plasma source user to perform measurements of current and voltage in order to calculate the amount of power delivered to the plasma. In a TCP apparatus, current and voltage may be measured at the output of the DC section of the RF power supply. Measured values at the output of the DC component are precise due to the DC nature of the voltage and current signals used for the calculations. However, the value of the power calculated based on DC measurements is not representative of the power delivered to the plasma due to the presence of lossy circuit components between the power measurement point and the plasma, such as switches in the RF section and the transformer core.

Alternatively, some applications implement RF measurements at the output of the power supply. At this measurements point, voltage and current signals are in phase since the impedance match transforms the complex-valued impedance of the plasma load into a resistive impedance that matches the output impedance of the power supply. Therefore, power can be calculated from root mean square (RMS) values of the current and voltage. These measurements are not as precise as DC measurements due to the time dependence of the signals. Although this type of measurement excludes some losses such as those attributed to the RF switches in the RF power generator, other losses continue to be present. Thus, accurate estimates of the power delivered to the plasma are difficult to obtain by measuring current and voltage at the output of the power supply components.

Yet another possibility is to measure voltage and current values at a point between the matching network and the plasma reactor. At this measurements point, voltage and current signals are out of phase, and real time measurements of current, voltage and phase are needed to calculate the power. These measurements are not as precise as DC measurements due to the time dependence of the signals. Besides, losses such as those attributed to the excitation transformer are still present. Thus, accurate estimates of the power delivered to the plasma are difficult to obtain by measuring current and voltage at the output of the power supply components.

It is then apparent that to obtain accurate estimations of the power delivered to the plasma, electrical measurements must be effected as close as possible to the plasma load.

Figure 3:
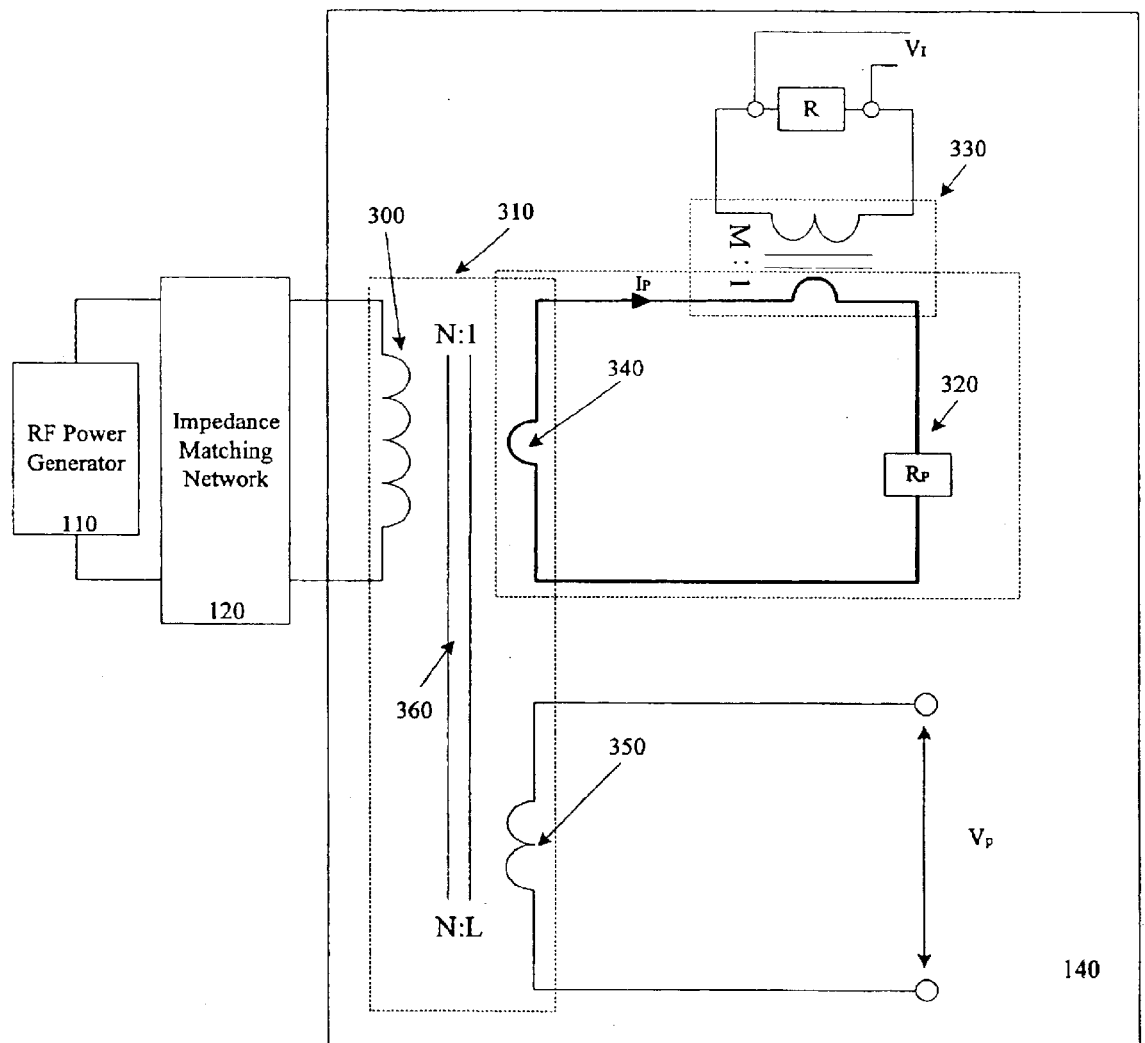
FIG. 3 illustrates an electrical representation of one embodiment of a plasma source coupled to a RF power generator via an impedance matching network.

According to one embodiment, the present invention provides an accurate estimation of the power delivered to the plasma. FIG. 3 illustrates an electrical representation of one embodiment of source 140 coupled to power generator 110 via impedance matching network 120.

Referring to FIG. 3, RF generator 110 is coupled to impedance matching network 120, which is in connected to the primary winding 300 of a transformer 310 within the plasma source 140. Plasma source 140 also includes a plasma loop 320 and a current transformer 330 with turn ratio of 1:M. Plasma loop 320 is represented by the secondary winding 340, the primary side of transformer 330, and a plasma resistance Rp. For many plasmas of interest, the resistance Rp dominates the value of impedance of the plasma loop 320. The turn ratio between primary 300 and secondary 340 is N:1.

In one embodiment, the core of current transformer 330 surrounds the plasma 320, which acts as a single-turn primary for this transformer. Further, a resistor (R) is connected to the secondary side of transformer 330 in order to provide a voltage measurement ($V_I$) proportional to the plasma current (Ip), such that $V_I=R*Ip/M$, where M is number of turns in the secondary of transformer 330.

According to another embodiment, the transformer 310 within the plasma source 140 includes an additional secondary winding 350 with a turn ratio of N:L. Secondary winding 350 is implemented to measure the closed loop voltage applied at plasma 320.

In one embodiment, winding 350 is a single turn of wire around the core 360 of transformer 310, positioned such as to enclose the same magnetic flux as the plasma loop 320. In such a configuration, the closed loop plasma voltage, Vplasma, is the same as the voltage Vp measured across secondary winding 350, that is Vp=Vplasma. According to another embodiment, a voltage reduction component (not shown) may be coupled to winding 350 to reduce the voltage by a predetermined amount in order to couple the voltage to a power measurement circuit (not shown).

Figure 4:
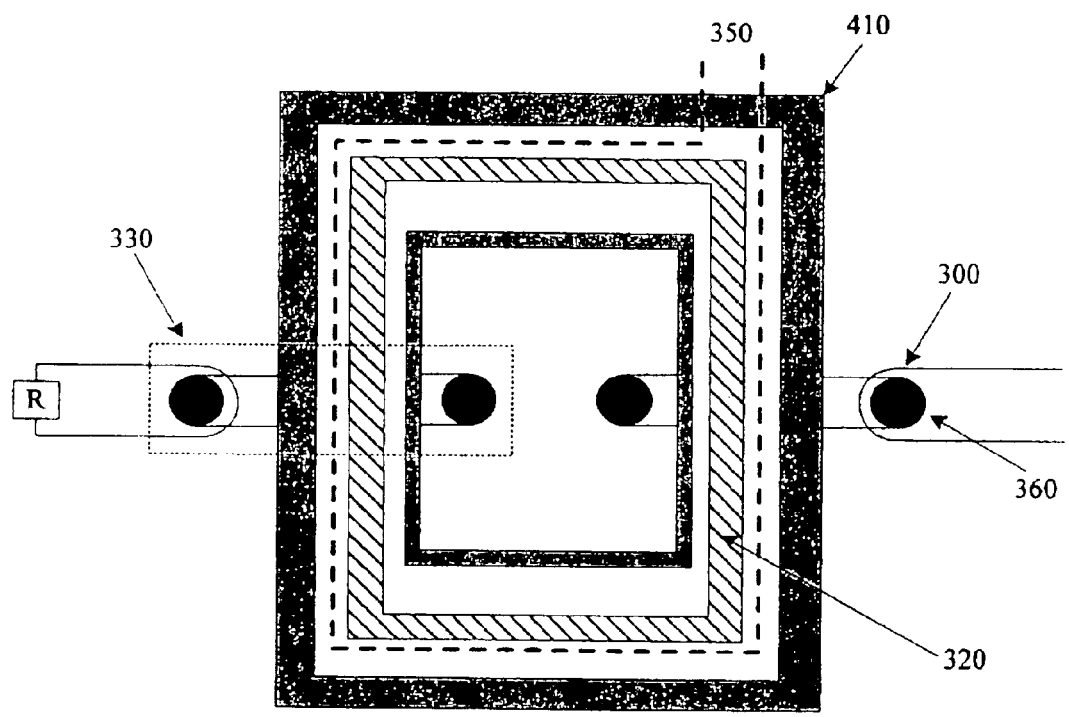
FIG. 4 illustrates one embodiment of a plasma source chamber.

FIG. 4 illustrates one embodiment of a TCP source 140 showing a typical disposition of the different components surrounding the plasma chamber 410. As described above, power is coupled to the plasma 320 through a transformer with magnetic core 360 and primary winding 300. Secondary 350 is used to estimate plasma voltage. The current transformer 330 measures the plasma current Ip.

Figure 5:
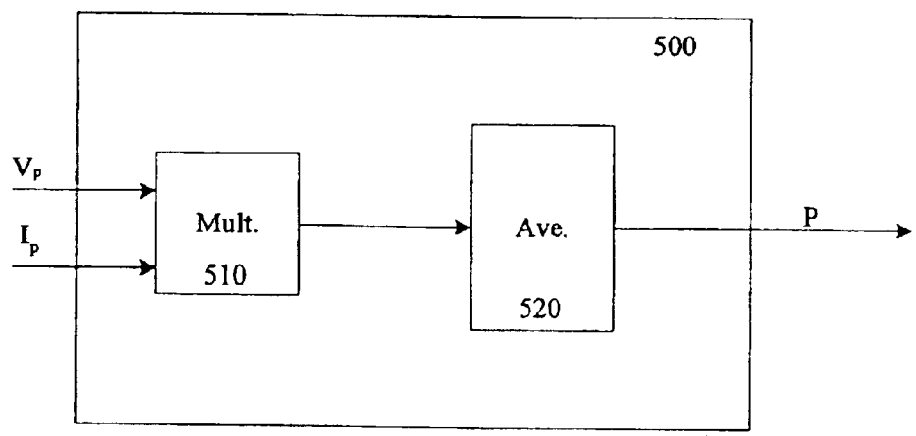
FIG. 5 illustrates one embodiment of a power measurement circuit.

FIG. 5 illustrates one embodiment of a power measurement circuit 500. Power measurement circuit 500 receives real time current values from current transformer 330 and real time voltage values from secondary winding 330. Power measurement circuit 500 includes a multiplier 510 and an averaging module 520. Multiplier 510 receives the real time voltage and current values, and multiplies each received value to obtain the value of the instantaneous power. Each calculated power value is transmitted to averaging module 520. Averaging module 520 calculates an average value of the power delivered to the plasma loop 320.

Figure 6:
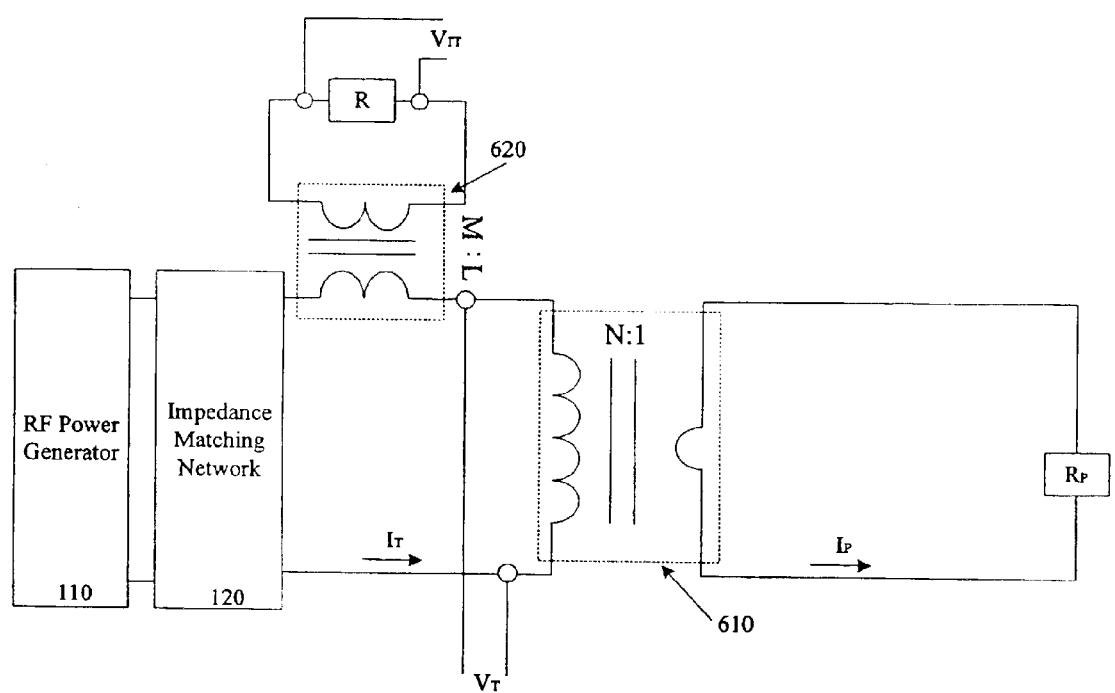
FIG. 6 illustrates an electrical representation of another embodiment of a plasma source coupled to a RF power generator via an impedance matching network.

FIG. 6 illustrates an electrical representation of another embodiment of source 140 coupled to power generator 110 via impedance matching network 120. In this embodiment, the voltage $V_T$ is measured at the input of transformer 610. A current transformer 620 with turn ratio of L:M measures current $I_T$ flowing through the primary of transformer 610. Using this configuration, the plasma voltage is estimated as $VP=V_T/N$ and the plasma current is estimated as $Ip=V_{IT}*M*N/(R*L)$.

Current transformer 620 operates in the same fashion as current transformer 330 described above in reference to FIG. 3. However, in this embodiment it is less complicated to position transformer 620 to measure current since it is not necessary to locate the transformer adjacent to the chamber. Moreover, in this embodiment, voltage is measured at the input of transformer 610. Therefore, an additional secondary winding (e.g., winding 350 in FIG. 3) is not required.

One of ordinary skill in the art will appreciate that the embodiments illustrated in FIGS. 3 and 6 may be mixed and matched. For example, the voltage measurement may be taken at the input of transformer 610, while the current measurement is implemented using transformer 330. Similarly, the current measurement may be taken using transformer 620, while the voltage is measured using secondary winding 350.

The above-described mechanism enables accurate estimations of the true plasma current and voltage values to be obtained. Consequently, accurate estimations of the power delivered to the plasma may be calculated.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a mechanism for measuring power in a transformer coupled plasma apparatus has been described.

What is claimed is:

1. An apparatus comprising:

a vacuum chamber;

an electrical transformer coupled to the vacuum chamber to induce an electromagnetic field within the vacuum chamber, the transformer including:

a primary winding;

a plasma loop within the chamber to operate as a first secondary winding coupled to the vacuum chamber; and a second secondary winding to measure the voltage along the plasma loop; and a current transformer to measure the current flow through the plasma loop.

2. The apparatus of claim 1 further comprising a power measurement circuit to receive time resolved current measurements from the current transformer and time resolved voltage measurements from the secondary winding.

3. The apparatus of claim 2 wherein the plasma loop and the secondary winding have the same turn ratio with respect to the primary winding.

4. The apparatus of claim 3 wherein the voltage measured at the secondary winding is reduced by a predetermined amount before the voltage is received at the power measurement circuit.

5. The apparatus of claim 2 wherein the power measurement circuit comprises:

a multiplier to multiply each time resolved current measurement by each time resolved voltage measurement to obtain time resolved power measurements; and an average module to average the time resolved power measurements.

6. The apparatus of claim 1 further comprising a power supply coupled to the primary winding of the transformer to supply power to the plasma loop.

7. The apparatus of claim 6 further comprising an impedance matching circuit coupled between the power supply and the primary winding of the transformer to match the impedance range of the transformer to the output impedance range of the RF power source.

8. The apparatus of claim 1 wherein the secondary winding is implemented by wrapping a single turn of wire around the plasma loop.

* * * * *